(12) United States Patent
Vrtis et al.

(10) Patent No.: US 12,264,258 B2
(45) Date of Patent: Apr. 1, 2025

(54) COMPOSITIONS COMPRISING SILACYCLOALKANES AND METHODS USING SAME FOR DEPOSITION OF SILICON-CONTAINING FILM

(71) Applicant: VERSUM MATERIALS US, LLC, Tempe, AZ (US)

(72) Inventors: Raymond N. Vrtis, Carlsbad, CA (US); Robert G. Ridgeway, Chandler, AZ (US); Xinjian Lei, Vista, CA (US); Ming Li, San Marcos, CA (US); Manchao Xiao, San Diego, CA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 17/629,698

(22) PCT Filed: Jul. 24, 2020

(86) PCT No.: PCT/US2020/043478
§ 371 (c)(1),
(2) Date: Jan. 24, 2022

(87) PCT Pub. No.: WO2021/016553
PCT Pub. Date: Jan. 28, 2021

(65) Prior Publication Data
US 2022/0267642 A1 Aug. 25, 2022

Related U.S. Application Data

(60) Provisional application No. 62/878,724, filed on Jul. 25, 2019.

(51) Int. Cl.
*C09D 183/16* (2006.01)
*C08G 77/50* (2006.01)
(Continued)

(52) U.S. Cl.
CPC ........... *C09D 183/16* (2013.01); *C08G 77/50* (2013.01); *C23C 16/308* (2013.01);
(Continued)

(58) Field of Classification Search
CPC ........ B05D 1/60; B05D 3/067; B05D 3/0254; B05D 1/62; H01L 21/02203;
(Continued)

(56) References Cited

U.S. PATENT DOCUMENTS 7,825,040 B1 11/2010 Fukazawa et al.
8,846,536 B2 9/2014 Draeger et al.
(Continued)

FOREIGN PATENT DOCUMENTS

CN 107406978 A 11/2017
WO WO-2019055393 A1 * 3/2019 ............ C07F 7/0807

*Primary Examiner* — Michael G Miller
(74) *Attorney, Agent, or Firm* — Daniel Roth; Versum Materials US, LLC

(57) ABSTRACT

Described herein are compositions and methods using same for forming a silicon-containing film such as without limitation a silicon carbide, silicon oxide, silicon nitride, silicon oxynitride, a carbon-doped silicon nitride, or a carbon-doped silicon oxide film on at least a surface of a substrate having a surface feature. In one aspect, the silicon-containing films are deposited using the co-deposition of an at least one first compound comprising a C—C double or C—C triple bond.

24 Claims, 2 Drawing Sheets

(51) Int. Cl.
*C23C 16/30* (2006.01)
*C23C 16/32* (2006.01)
*C23C 16/34* (2006.01)
*C23C 16/50* (2006.01)
*C23C 16/56* (2006.01)

(52) U.S. Cl.
CPC .......... *C23C 16/325* (2013.01); *C23C 16/345* (2013.01); *C23C 16/50* (2013.01); *C23C 16/56* (2013.01)

(58) Field of Classification Search
CPC ......... H01L 21/02216; H01L 21/02126; H01L 21/02348; H01L 21/02274; H01B 3/46; C23C 16/30; C23C 16/50; C23C 16/56; C23C 16/401
See application file for complete search history.

(56) References Cited

U.S. PATENT DOCUMENTS

| | | | |
|---|---|---|---|
| 8,889,566 | B2 | 11/2014 | Chatterjee et al. |
| 9,234,276 | B2 | 1/2016 | Varadarajan |
| 9,455,138 | B1 | 9/2016 | Fukazawa et al. |
| 2004/0166692 | A1 | 8/2004 | Loboda et al. |
| 2008/0009141 | A1* | 1/2008 | Dubois ............ H01L 21/02208 438/758 |
| 2010/0022792 | A1 | 1/2010 | Shen |
| 2011/0130584 | A1 | 6/2011 | Ohno et al. |
| 2013/0217241 | A1 | 8/2013 | Underwood et al. |
| 2016/0314962 | A1 | 10/2016 | Higashino et al. |
| 2016/0326642 | A1 | 11/2016 | Hara et al. |
| 2018/0061636 | A1 | 3/2018 | Li et al. |
| 2020/0270749 | A1 | 8/2020 | Li et al. |

* cited by examiner

COMPOSITIONS COMPRISING SILACYCLOALKANES AND METHODS USING SAME FOR DEPOSITION OF SILICON-CONTAINING FILM

CROSS-REFERENCE TO RELATED APPLICATIONS

This application is a National Stage filing under 35 U.S.C. 371 of International Patent Application No. PCT/US2020/043478, filed on Jul. 24, 2020, which claims priority under 35 U.S.C. § 119(e) to U.S. provisional patent application No. 62/878,724, filed on Jul. 25, 2019. The contents of these applications are incorporated herein by reference in their entirety.

FIELD OF THE INVENTION

Described herein are methods and compositions for depositing flowable, stoichiometric or non-stoichiometric, silicon carbide or silicon carbonitride films using a silicon precursor comprising at least one silacycloalkane. More specifically, described herein are deposition processes, such as without limitation, flowable chemical vapor deposition (FCVD), remote plasma enhanced chemical vapor deposition (RPCVD), in-situ assisted remote plasma enhanced chemical vapor deposition (in-situ assist RPCVD), plasma enhanced chemical vapor deposition (PECVD), cyclical remote plasma enhanced chemical vapor deposition (C-RPCVD using silacycloalkane precursors, and compositions comprising same, that are used to deposit dielectric films.

BACKGROUND OF THE INVENTION

Low pressure chemical vapor deposition (LPCVD) processes are one of the more widely accepted methods used by semiconductor industry for the deposition of silicon nitride films. Low pressure chemical vapor deposition (LPCVD) using ammonia may require deposition temperatures of greater than 650° C. to obtain reasonable growth rates and uniformities. Higher deposition temperatures are typically employed to provide improved film properties. One of the more common industry methods to grow silicon nitride is through low pressure chemical vapor deposition in a hot wall reactor at temperatures greater than 750° C. using the silane, dichlorosilane, and/or ammonia as precursors. However, there are several drawbacks using this method. For example, certain precursors, such as silane, are pyrophoric. This may present problems in handling and usage. Also, films deposited from dichlorosilane may contain certain impurities, such as chlorine and ammonium chloride, which are formed as byproducts during the deposition process.

U.S. Pat. No. 9,455,138 discloses a method for forming a dielectric film in a trench on a substrate by plasma-enhanced atomic layer deposition (PEALD) performs ≥1 process cycles, each process cycle including (i) feeding a silicon-containing precursor in a pulse, (ii) supplying a hydrogen-containing reactant gas at a flow rate 30~800 sccm in the absence of nitrogen-containing gas, (iii) supplying a noble gas to the reaction space, and (iv) applying RF power in the presence of the reactant gas and the noble gas and in the absence of any precursor in the reaction space, to form a monolayer constituting a dielectric film on a substrate at a growth rate of less than one at. layer thickness per cycle.

U.S. Pat. No. 9,234,276 discloses methods and systems for providing SiC films. A layer of SiC can be provided under process conditions that employ one or more Si-containing precursors that have ≥1 Si—H bonds and/or Si—Si bonds. The Si-containing precursors may also have ≥1 Si—O bonds and/or Si—C bonds. One or more radical species in a substantially low energy state can react with the Si-containing precursors to form the SiC film. The radical species can be formed in a remote plasma source.

U.S. Pat. No. 8,846,536 discloses a method to deposit and modify the flowable dielectric film. By one or more integration processes, the wet etch rate of the flowable dielectric film can be changed by a factor of at least 10.

US Publ. No. 2013/0217241 discloses the deposition and treatment of Si—C—N containing flowable layers. Si and C may come from a Si—C-containing precursor, while N may come from an N-containing precursor. The initial Si—C—N containing flowable layer is treated to remove components that enables the flowability. Removal of these components can increase etch tolerance, reduce shrinkage, adjust film tension and electrical properties. The post treatment can be thermal annealing, UV exposure or high density plasma.

U.S. Pat. No. 8,889,566 discloses a method to deposit flowable film by exciting the silicon precursor with a local plasma and depositing with a second plasma. The silicon precursor can be silylamine, higher order silane or halogenated silane. The second reactant gas can be $NH_3$, $N_2$, $H_2$, and/or $O_2$.

U.S. Pat. No. 7,825,040 discloses a method of filling a gap by introducing an alkoxysilane or aminosilane precursor and depositing a flowable Si-containing film by plasma reaction. The precursor doesn't contain a Si—C bond or a C—C bond.

U.S. Pat. Nos. 8,889,566, 7,521,378, and 8,575,040 describe an approach to depositing a silicon oxide film using flowable chemical vapor deposition process is gas phase polymerization. Compounds such as trisilylamine (TSA) was used to deposit Si, H, and N containing oligomers that were subsequently oxidized to $SiO_x$ films using ozone exposure.

U.S. Pat. No. 8,846,536 discloses a method to deposit and modify the flowable dielectric film. By one or more integration processes, the wet etch rate of the flowable dielectric film can be changed by a factor of at least 10.

Accordingly, there is a need in the art to provide a low temperature (e.g., processing temperature of 400° C. or below, especially 150° C. or below) method for depositing a flowable, high quality, silicon carbide or silicon carbonitride film to fill vias or trenches in semiconductor fabrication processes wherein the film has one or more of the following characteristics: a density of 2.2 grams per cubic centimeter (g/cc) or greater, a low wet etch rate (as measured in dilute hydrofluoric acid (HF)), and combinations thereof compared to other silicon nitride films using other deposition methods or precursors.

BRIEF SUMMARY OF THE INVENTION

In one aspect, there is provided a method for depositing a silicon-containing film in a flowable chemical deposition process, the method comprising: placing a substrate comprising a surface feature into a reactor which is at one or more temperatures ranging from −20° C. to about 150° C.; introducing into the reactor a composition comprising at least one silacycloalkane precursor compound represented by formula I:

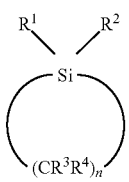

wherein $R^1$ is selected from the group consisting of hydrogen, a linear or branched $C_1$ to $C_{10}$ alkyl group, cyclic $C_3$ to $C_{10}$ alkyl group, a linear or branched $C_2$ to $C_{10}$ alkenyl group, and a linear or branched $C_2$ to $C_{10}$ alkynyl group; $R^2$ is selected from the group consisting of a linear or branched $C_2$ to $C_6$ alkenyl group, a linear or branched $C_2$ to $C_6$ alkynyl group, and cyclic $C_3$ to $C_{10}$ alkyl group; $R^3$ and $R^4$ are each independently selected from the group consisting of hydrogen, and a linear or branched $C_1$ to $C_{10}$ alkyl group; and n is an integer from 3-6; providing a plasma source into the reactor to at least partially react the at least one silacycloalkane precursor compound to form a flowable liquid, wherein the flowable liquid at least partially fills a portion of the surface feature, and wherein the at least one silacycloalkane precursor compound is substantially free of self-polymerization or self-oligomerization impurities. In certain embodiments of this invention, an at least one second silicon compound comprising at least two Si—H groups such as silane, disilane, trisilane, trisilylamine and its derivatives, organoaminosilanes such as di-iso-propylaminosilane, di-iso-propylaminodisilane can be employed to adjust the content of silicon in the resulting silicon containing films.

In another aspect, there is provided a method for depositing a silicon-containing film in a flowable chemical deposition process, the method comprising: placing a substrate comprising surface features having pores, or vias, or trenches into a reactor which is at one or more temperatures ranging from −20° C. to about 150° C.; introducing into the reactor a composition comprising at least one silacycloalkane precursor compound represented by formula I:

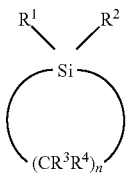

wherein $R^1$ is selected from the group consisting of hydrogen, a linear or branched $C_1$ to $C_{10}$ alkyl group, cyclic $C_3$ to $C_{10}$ alkyl group, a linear or branched $C_2$ to $C_{10}$ alkenyl group, and a linear or branched $C_2$ to $C_{10}$ alkynyl group; $R^2$ is selected from the group consisting of a linear or branched $C_2$ to $C_6$ alkenyl group, a linear or branched $C_2$ to $C_6$ alkynyl group, and cyclic $C_3$ to $C_{10}$ alkyl group; $R^3$ and $R^4$ are each independently selected from the group consisting of hydrogen, and a linear or branched $C_1$ to $C_{10}$ alkyl group; and n is an integer from 3-6; providing a plasma source comprising one or both of oxygen and nitrogen into the reactor to at least partially react the at least one silacycloalkane precursor compound to form a flowable liquid wherein the flowable liquid at least partially fills a portion of the surface feature, and wherein the at least one silacycloalkane precursor compound is substantially free of self-polymerization or self-oligomerization impurities. In certain embodiments of this invention, an at least one second silicon compound comprising at least two Si—H groups such as silane, disilane, trisilane, trisilylamine and its derivatives, organoaminosilanes such as di-iso-propylaminosilane, di-iso-propylaminodisilane can be employed to adjust the content of silicon in the resulting silicon containing films.

The embodiments of the invention can be used alone or in combinations with each other.

DETAILED DESCRIPTION OF THE INVENTION

Figure 1:
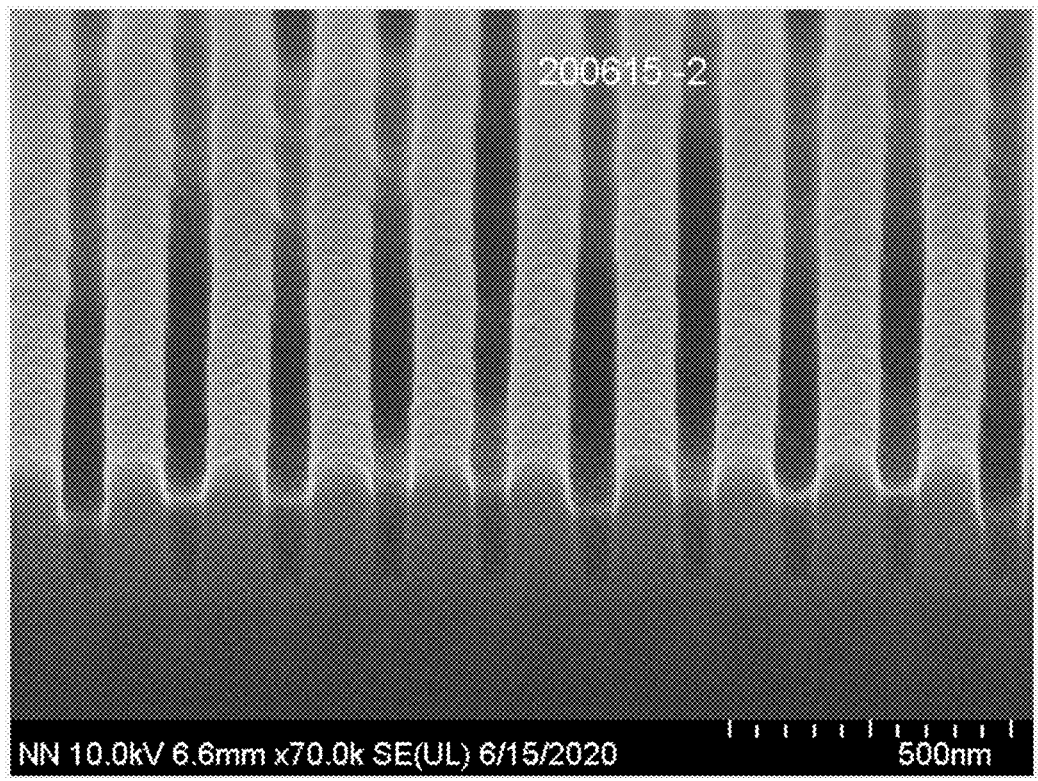
FIG. 1 is an SEM micrograph image of a film that was deposited according to the Example and thermal annealed at 400° C. in inert environment.

The compositions or formulations described herein and methods using same overcome the problems of the prior art by depositing a silicon-containing film on at least a portion of a substrate surface that provides desirable film properties upon post-deposition treatment. In certain embodiments, the substrate comprises a surface feature. The silicon-containing film is selected from the group consisting of a silicon carbide, a carbon-doped silicon nitride, a silicon oxynitride, and a carbon-doped silicon oxynitride film. The term "surface feature", as used herein, means that the substrate or partially fabricated substrate that comprises one or more of the following: pores, trenches, shallow trench isolation (STI), vias, reentrant feature, or the like. The compositions can be pre-mixed compositions, pre-mixtures (mixed before being used in the deposition process), or in-situ mixtures (mixed during the deposition process). Thus, in this disclosure the terms "mixture", "formulation", and "composition" are interchangeable.

In one aspect, there is provided a method for depositing a silicon-containing film in a flowable chemical deposition process, the method comprising: placing a substrate comprising a surface feature into a reactor which is at one or more temperatures ranging from −20° C. to about 150° C.; introducing into the reactor a composition comprising at least one silacycloalkane precursor compound represented by formula I:

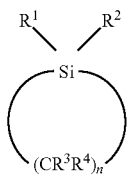

wherein $R^1$ is selected from the group consisting of hydrogen, a linear or branched $C_1$ to $C_{10}$ alkyl group, cyclic $C_3$ to $C_{10}$ alkyl group, a linear or branched $C_2$ to $C_{10}$ alkenyl group, and a linear or branched $C_2$ to $C_{10}$ alkynyl group; $R^2$ is selected from the group consisting of a linear or branched $C_2$ to $C_6$ alkenyl group, a linear or branched $C_2$ to $C_6$ alkynyl group, and cyclic $C_3$ to $C_{10}$ alkyl group; $R^3$ and $R^4$ are each independently selected from the group consisting of hydrogen, and a linear or branched $C_1$ to $C_{10}$ alkyl group; and n is an integer from 3-6; providing a plasma source into the reactor to at least partially react the at least one silacycloalkane precursor compound to form a flowable liquid, wherein the flowable liquid at least partially fills a portion of the surface feature, and wherein the at least one silacycloalkane precursor compound is substantially free of self-polymerization or self-oligomerization impurities.

In one particular embodiment, there is provided a method for depositing a silicon-containing film in a flowable chemical deposition process, the method comprising: placing a substrate comprising surface features having pores, or vias, or trenches into a reactor which is at one or more temperatures ranging from −20° C. to about 150° C.; introducing into the reactor a composition comprising at least one silacycloalkane precursor compound represented by formula I:

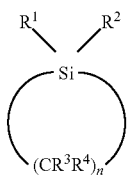

wherein $R^1$ is selected from the group consisting of hydrogen, a linear or branched $C_1$ to $C_{10}$ alkyl group, cyclic $C_3$ to $C_{10}$ alkyl group, a linear or branched $C_2$ to $C_{10}$ alkenyl group, and a linear or branched $C_2$ to $C_{10}$ alkynyl group; $R^2$ is selected from the group consisting of a linear or branched $C_2$ to $C_6$ alkenyl group, a linear or branched $C_2$ to $C_6$ alkynyl group, and cyclic $C_3$ to $C_{10}$ alkyl group; $R^3$ and $R^4$ are each independently selected from the group consisting of hydrogen, and a linear or branched $C_1$ to $C_{10}$ alkyl group; and n is an integer from 3-6; providing a plasma source comprising one or both of oxygen and nitrogen into the reactor to at least partially react the at least one silacycloalkane precursor compound to form a flowable liquid wherein the flowable liquid at least partially fills a portion of the surface feature, and wherein the at least one silacycloalkane precursor compound is substantially free of self-polymerization or self-oligomerization impurities.

In another embodiment, silicon precursors for use in the method of the present invention are at least one silacycloalkane precursor selected from the group consisting of compounds represented by the structure of Formula Ia:

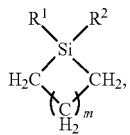

wherein $R^1$ and $R^2$ are as defined above and m is from 1 to 4.

Exemplary compounds having Formula I (inclusive of Ia) include, but are not limited to 1,1-divinyl-1-silacyclobutane, 1-methyl-1-vinyl-1-silacyclobutane, 1-ethyl-1-vinyl-1-silacyclobutane, 1,1-divinyl-1-silacyclopentane, 1-methyl-1-vinyl-1-silacyclopentane, 1-ethyl-1-vinyl-1-silacyclopentane, 1,1-divinyl-1-silacyclohexane, 1-methyl-1-vinyl-1-silacyclohexane, or 1-ethyl-1-vinyl-1-silacyclohexane, 1,1-diallyl-1-silacyclobutane, 1-methyl-1-allyl-1-silacyclobutane, 1-ethyl-1-allyl-1-silacyclobutane, 1,1-diallyl-1-silacyclopentane, 1-methyl-1-allyl-1-silacyclopentane, 1-ethyl-1-allyl-1-silacyclopentane, 1,1-diallyl-1-silacyclohexane, 1-methyl-1-allyl-1-silacyclohexane, or 1-ethyl-1-allyl-1-silacyclohexane, 1,1-diethynyl-1-silacyclobutane, 1-methyl-1-ethynyl-1-silacyclobutane, 1-ethyl-1-ethynyl-1-silacyclobutane, 1,1-ethynyl-1-silacyclopentane, 1-methyl-1-ethynyl-1-silacyclopentane, 1-ethyl-1-ethynyl-1-silacyclopentane, 1,1-di ethynyl-1-silacyclohexane, 1-methyl-1-ethynyl-1-silacyclohexane, or 1-ethyl-1-ethynyl-1-silacyclohexane.

For compounds represented by Formula I and Ia, preferably at least one $R^1$ or $R^2$ both are selected from an alkenyl group having at least one carbon-carbon double or alkynyl group having at least one triple bond.

In the formulae above and throughout the description, the term "linear or branched alkyl" denotes a linear functional group having from 1 to 10, 3 to 10, or 1 to 6 carbon atoms.

In the formulae above and throughout the description, the term "branched alkyl" denotes a linear functional group having from 3 to 10, or 1 to 6 carbon atoms. Exemplary linear alkyl groups include, but are not limited to, methyl, ethyl, propyl, butyl, pentyl, and hexyl groups. Exemplary branched alkyl groups include, but are not limited to, isopropyl, isobutyl, sec-butyl, tert-butyl, iso-pentyl, tert-pentyl, isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulae above and throughout the description, the term "cyclic alkyl" denotes a cyclic group having from 3 to 10 or 5 to 10 atoms. Exemplary cyclic alkyl groups include, but are not limited to, cyclobutyl, cyclopentyl, cyclohexyl, and cyclooctyl groups. In certain embodiments, the cyclic alkyl group may have one or more $C_1$ to $C_{10}$ linear, branched substituents, or substituents containing oxygen or nitrogen atoms. In this or other embodiments, the cyclic alkyl group may have one or more linear or branched alkyls or alkoxy groups as substituents, such as, for example, a methylcyclohexyl group or a methoxycyclohexyl group.

In the formulae above and throughout the description, the term "aryl" denotes an aromatic cyclic functional group having from 3 to 10 carbon atoms, from 5 to 10 carbon atoms, or from 6 to 10 carbon atoms. Exemplary aryl groups include, but are not limited to, phenyl, benzyl, chlorobenzyl, tolyl, and o-xylyl.

In the formulae above and throughout the description, the term "alkenyl group" denotes a group which has one or more carbon-carbon double bonds and has from 2 to 12, from 2 to 10, or from 2 to 6 carbon atoms. Exemplary alkenyl groups include, but are not limited to, vinyl or allyl groups.

The term "alkynyl group" denotes a group which has one or more carbon-carbon triple bonds and has from 2 to 12 or from 2 to 6 carbon atoms. Exemplary alkynyl groups include, but are not limited to, ethynyl or 2-propyl-1-yl groups The term "alkylene group" denotes a group which is derived from an alkyl by removal of two hydrogen atoms. Exemplary alkylene groups include, but are not limited to, methylene (—$CH_2$—) or ethylene (—$CH_2CH_2$—) groups.

In the formulae above and through the description, the term "unsaturated" as used herein means that the functional group, substituent, ring or bridge has one or more carbon double or triple bonds. An example of an unsaturated ring can be, without limitation, an aromatic ring such as a phenyl ring. The term "saturated" means that the functional group, substituent, ring or bridge does not have one or more double or triple bonds.

In certain embodiments, one or more of the alkyl group, alkenyl group, alkynyl group, aryl group, and/or cyclic alkyl group in the formulae may be "substituted" or have one or more atoms or group of atoms substituted in place of, for example, a hydrogen atom. Exemplary substituents include, but are not limited to, oxygen, sulfur, halogen atoms (e.g., F, Cl, I, or Br), nitrogen, alkyl groups, and phosphorous. In other embodiments, one or more of the alkyl group, alkenyl group, alkynyl group, aromatic and/or aryl group in the formulae may be unsubstituted.

The silicon precursor compounds described herein may be delivered to the reaction chamber such as a plasma enhanced CVD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

The deposition can be performed using either direct plasma or remote plasma source. For the remote plasma source, a dual plenum showerhead can be used to prevent premixing between the vapors of the silicon precursors and radicals inside showerhead and thus avoid generating particles. Teflon coating of the showerhead parts can be executed to maximize the radical lifetime and radical transmission The silacycloalkane compounds having Formula I according to the present invention and compositions comprising the silacycloalkane precursor compounds having Formula I and Ia according to the present invention are preferably substantially free of halide. As used herein, the term "substantially free" as it relates to halide ions such as chloride, bromide or iodide (or halides) such as, for example, chlorides (i.e., chloride-containing species such as HCl or silacycloalkane compounds having at least one Si—Cl bond) and fluorides, bromides, and iodides, means less than 5 ppm (by weight) measured by Ion Chromatography (IC) or ICP-MS, preferably less than 3 ppm measured by IC or ICP-MS, and more preferably less than 1 ppm measured by IC or ICP-MS, and most preferably 0 ppm measured by IC or ICP-MS. Chlorides are known to act as decomposition catalysts for the silacycloalkane compounds having Formulae I. Significant levels of chloride in the final product can cause the silacycloalkane precursor compounds to degrade. The gradual degradation of the silacycloalkane compounds may directly impact the film deposition process making it difficult for the semiconductor manufacturer to meet film specifications. In addition, the shelf-life or stability is negatively impacted by the higher degradation rate of the silacycloalkane compounds having Formulae I thereby making it difficult to guarantee a 1-2 year shelf-life. Therefore, the accelerated decomposition of the silacycloalkane compounds having Formulae I (inclusive of Formula Ia) presents safety and performance concerns related to the formation of these flammable and/or pyrophoric gaseous byproducts. The silacycloalkane compounds having Formula I are preferably substantially free of metal ions such as, $Li^+$, $Na^+$, $K^+$, $Mg^{2+}$, $Ca^{2+}$, $Al^{3+}$, $Fe^{2+}$, $Fe^{2+}$, $Fe^{3+}$, $Ni^{2+}$, $Cr^{3+}$. As used herein, the term "substantially free" as it relates to Li, Na, K, Mg, Ca, Al, Fe, Ni, Cr means less than 5 ppm (by weight), preferably less than 3 ppm, and more preferably less than 1 ppm, and most preferably 0.1 ppm as measured by ICP-MS. In some embodiments, the silacycloalkane compounds having Formulae I or Ia are free of metal ions such as, $Li^+$, $Na^+$, $K^+$, $Mg^{2+}$, $Ca^{2+}$, $Al^{3+}$, $Fe^{2+}$, $Fe^{2+}$, $Fe^{3+}$, $Ni^{2+}$, $Cr^{3+}$. As used herein, the term "free of" metal impurities as it relates to Li, Na, K, Mg, Ca, Al, Fe, Ni, Cr, noble metal such as volatile Ru or Pt complexes from ruthenium or platinum catalysts used in the synthesis, means less than 1 ppm, preferably 0.1 ppm (by weight) as measured by ICP-MS or other analytical method for measuring metals.

Compositions according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorodislanes, bromodisilanes, or iododisilanes thereby avoiding the production of by-products that contain halide ions. In addition, the aforementioned reagents should be substantially free of chloride impurities such that the resulting crude product is substantially free of chloride impurities. In a similar manner, the synthesis should not use halide-based solvents, catalysts, or solvents which contain unacceptably high levels of halide contamination. The crude product may also be treated by various purification methods to render the final product substantially free of halides such as chlorides. Such methods are well described in the prior art and, may include, but are not limited to purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available $MgO$—$Al_2O_3$ blends can be used to remove halides such as chloride.

In some embodiments, compositions comprising silacycloalkanes according to the present disclosure comprise a stabilizer compound. Exemplary stabilizer compounds include 2,6-di-tert-butyl-4-methyl phenol (or BHT for butylhydroxytoluene), 2,2,6,6-tetramethyl-1-piperidinyloxy (TEMPO), 2-tert-butyl-4-hydroxyanisole, 3-tert-butyl-4-hydroxyanisole, propyl ester 3,4,5-trihydroxy-benzoic acid, 2-(1,1-dimethylethyl)-1,4-benzenediol, diphenylpicrylhydrazyl, 4-tert-butylcatechol, N-methylaniline, p-methoxydiphenylamine, diphenylamine, N,N'-diphenyl-p-phenylenediamine, p-hydroxydiphenylamine, phenol, octadecyl-3-(3, 5-di-tert-butyl-4-hydroxyphenyl) propionate, tetrakis (methylene (3,5-di-tert-butyl)-4-hydroxy-hydrocinnamate) methane, phenothiazines, alkylamidonoisoureas, thiodiethylene bis (3,5,-di-tert-butyl-4-hydroxy-hydrocinnamate, 1,2,-bis (3,5-di-tert-butyl-4-hydroxyhydrocinnamoyl) hydrazine, tris (2-methyl-4-hydroxy-5-tert-butylphenyl) butane, cyclic neopentanetetrayl bis (octadecyl phosphite), 4,4'-thiobis (6-tert-butyl-m-cresol), 2,2'-methylenebis (6-tert-butyl-p-cresol), oxalyl bis (benzylidenehydrazide) and naturally occurring antioxidants such as raw seed oils, wheat germ oil, tocopherols and gums. The function of the stabilizer compound is to prevent self-polymerization or oligomerization of the silacycloalkane precursor. Self-polymerization or oligomerization products are unwanted impurities because they have lower volatility and can clog the injector system of the process tool from which they are delivered to the process chamber. A disruption in precursor flow will compromise the repeatability of film growth.

In embodiments, compositions comprising the silacycloalkane precursor compounds of Formula I as disclosed herein are stored in a container that permits transmission into the container of no more than 10% of ultraviolet and visible light having a wavelength of between 290 nm to 450 nm. Such container prevents any radiation-induced formation of unwanted self-polymerization or self-oligomerization products. In some embodiments, the container permits transmission of no more than 7% of ultraviolet and visible light having a wavelength of between 290 nm to 450 nm. In other embodiments, the container permits transmission of no more than 5% of ultraviolet and visible light having a wavelength of between 290 nm to 450 nm. In other embodiments, the container permits transmission of no more than 3% of ultraviolet and visible light having a wavelength of between 290 nm to 450 nm. In other embodiments, the container permits transmission of no more than 2% of ultraviolet and visible light having a wavelength of between 290 nm to 450 nm. In yet another embodiments, the container permits transmission of no more than 1% of ultraviolet and visible light having a wavelength of between 290 nm to 450 nm. In still other embodiments, the container permits 0% transmission into the container of ultraviolet and visible light having a wavelength of between 290 nm to 450 nm.

The percent of UV and visible light transmission through a solid medium can be measured by any method known to those skilled in the art such as, for example, UV-VIS absorption spectroscopy, where a sample is illuminated from one side, and the intensity of the light that exits from the sample in every direction is measured. Any UV-VIS absorption instrument commercially available may be employed to measure transmission of ultraviolet and visible light having a wavelength of between 290 nm to 450 nm according to the present invention.

The material from which the container is made and the thickness of the container's wall structure cooperably inhibits transmission of light through the container wall structure having a wavelength between about 290 nm to 450 nm. In some embodiments, the container is made of stainless steel. If a glass or quartz container is employed, then either the container has walls thick enough to prevent the transmission of ultraviolet and visible light having a wavelength of between 290 nm to 450 nm or the walls of such container are covered with a layer of material to prevent the transmission of ultraviolet and visible light having a wavelength of between 290 nm to 450 nm. Examples of such materials include metal foils and synthetic resin coatings.

An example of a container that can be employed in the present invention is the high-purity chemical container disclosed in U.S. Pat. No. 7,124,913 to Air Products and Chemicals, Inc. (Allentown, PA), and incorporated herein by reference.

Preferably, the container once filled with the silacycloalkane precursor compounds of Formula I as disclosed herein is stored at a temperature of from 15° C. to 30° C., and more preferably at room temperature because heat may also initiate self-polymerization or oligomerization of the precursor compounds.

Compositions comprising the silacycloalkane precursor compounds of Formulas I as disclosed herein are preferably substantially free of water or organosilane impurities such as those formed by self-polymerization or self-oligomerization. As used herein, the term "substantially free" as it relates to self-polymerization or self-oligomerization impurities is less than 100 ppm (by weight), preferably less than 50 ppm, and more preferably less than 10 ppm; the sum of all self-polymerization or self-oligomerization impurities analyzed by gas chromatography (GC) is less than 1.0 wt. %, preferably less than 0.5 wt. %, more preferably less than 0.1 wt. %, and yet more preferably 0 wt. %.

For those embodiments relating to a composition comprising a solvent(s) and at least one compound described herein, the solvent or mixture thereof selected does not react with the silicon compound. The amount of solvent by weight percentage in the composition ranges from 0.5% by weight to 99.5% or from 10% by weight to 75%. In this or other embodiments, the solvent has a boiling point (b.p.) similar to the b.p. of the precursors of Formulae I and II or the difference between the b.p. of the solvent and the b.p. of the silicon precursor precursors of Formula II is 40° C. or less, 30° C. or less, or 20° C. or less, 10° C. or less, or 5° C. or less. Alternatively, the difference between the boiling points ranges from any one or more of the following end points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

The method used to form the films or coatings described herein are flowable chemical deposition processes. Examples of suitable deposition processes for the method disclosed herein include, but are not limited to, flowable chemical vapor deposition (FCVD), remote plasma enhanced chemical vapor deposition (RPCVD), in-situ assisted remote plasma enhanced chemical vapor deposition (in-situ assist RPCVD), plasma enhanced chemical vapor deposition (PECVD), cyclical remote plasma enhanced chemical vapor deposition (C-RPCVD). As used herein, the term "flowable chemical vapor deposition processes" refers to any process wherein a substrate is exposed to one or more volatile precursors, which react and/or decompose on the substrate surface to provide flowable oligomeric silicon-containing species and then produce the solid film or material upon further treatment. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the films are deposited using a plasma-based (e.g., remote generated or in situ) CVD process. The term "reactor" as used herein, includes without limitation, a reaction chamber or deposition chamber.

In certain embodiments, the substrate may be exposed to one or more pre-deposition treatments such as, but not limited to, a plasma treatment, thermal treatment, chemical treatment, ultraviolet light exposure, electron beam exposure, and combinations thereof to affect one or more properties of the films. These pre-deposition treatments may occur under an atmosphere selected from inert, oxidizing, and/or reducing.

Energy is applied to the at least one of the compound, nitrogen-containing source, oxygen source, other precursors or combination thereof to induce reaction and to form the silicon-containing film or coating on the substrate. Such energy can be provided by, but not limited to, thermal, plasma, pulsed plasma, helicon plasma, high density plasma, inductively coupled plasma, X-ray, e-beam, photon, microwave plasma, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

As previously mentioned, the method deposits a film upon at least a portion of the surface of a substrate comprising a surface feature. The substrate is placed into the reactor and the substrate is maintained at one or more temperatures ranging from about −20° C. to about 100° C. In one particular embodiment, the temperature of the substrate is less than the walls of the chamber. The substrate temperature is held at a temperature below 150° C., preferably at a temperature below 50° C. and greater than −20° C.

As previously mentioned, the substrate comprises one or more surface features. In one particular embodiment, the surface feature(s) have a width of 100 μm or less, 1 μm in width or less, or 0.5 μm in width. In this or other embodiments, the aspect ratio (the depth to width ratio) of the surface features, if present, is 0.1:1 or greater, or 1:1 or greater, or 10:1 or greater, or 20:1 or greater, or 40:1 or greater. The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, silicon oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

In certain embodiments, the reactor is at a pressure below atmospheric pressure or 750 torr ($10^5$ Pascals (Pa)) or less, or 100 torr (13332 Pa) or less. In other embodiments, the pressure of the reactor is maintained at a range of about 0.1 torr (13 Pa) to about 10 torr (1333 Pa). Yet in a preferred embodiment, the pressure of the reactor is maintained at a range of about 10 torr (1333 Pa) to about 30 torr (4000 Pa) to provide flowable silicon oxide with less shrinkage upon thermal annealing.

In one particular embodiment, the introducing step, wherein the at least one compound and a plasma comprising nitrogen are introduced into the reactor, is conducted at one or more temperatures ranging from about −20° C. to about 150° C., or from about −20° C. to about 125° C., or from about −20° C. to 75° C., or from about 20° C. to about 100° C., or from about 20° C. to about 60° C., or from about 20° C. to about 75° C., or from about 20° C. to about 40° C. In these or other embodiments, the substrate comprises a semiconductor substrate comprising a surface feature. The plasma comprising nitrogen can be selected from the group consisting of nitrogen plasma, nitrogen/hydrogen plasma, nitrogen/helium plasma, nitrogen/argon plasma, ammonia plasma, ammonia/helium plasma, ammonia/argon plasma, ammonia/nitrogen plasma, $NF_3$, $NF_3$ plasma, organic amine plasma, and mixtures thereof. The at least one compound and nitrogen source react and form a silicon nitride film (which is non-stoichiometric) on at least a portion of the surface feature and substrate. The term "organic amine" as used herein describes an organic compound that has at least one nitrogen atom. Examples of organoamine, but are not limited to, methylamine, ethylamine, propylamine, iso-propylamine, tert-butylamine, sec-butylamine, tert-amylamine, ethylenediamine, dimethylamine, trimethylamine, diethylamine, pyrrole, 2,6-dimethylpiperidine, di-n-propylamine, di-iso-propylamine, ethylmethylamine, N-methylaniline, pyridine, and triethylamine.

In some embodiments, the plasma source comprises hydrogen and is selected from the group consisting of hydrogen plasma, a plasma comprising hydrogen and helium, a plasma comprising hydrogen and argon, and mixtures thereof.

In certain embodiments, after the silicon containing film is deposited, the substrate is optionally treated with an oxygen-containing source under certain process conditions sufficient to make the silicon nitride film form a silicon oxide or a silicon oxynitride or carbon doped silicon oxide film. The oxygen-containing source can be selected from the group consisting of water ($H_2O$), oxygen ($O_2$), oxygen plasma, ozone ($O_3$), NO, $N_2O$, carbon monoxide (CO), carbon dioxide ($CO_2$), $N_2O$ plasma, carbon monoxide (CO) plasma, carbon dioxide ($CO_2$) plasma, and combinations thereof.

In certain embodiments, the resultant silicon-containing films or coatings can be exposed to a post-deposition treatment such as, but not limited to, a plasma treatment, chemical treatment, ultraviolet light exposure, infrared exposure, electron beam exposure, and/or other treatments to affect one or more properties of the film. Such post treatments may be carried out under inert atmosphere's (helium, argon, nitrogen etc.) or under reducing (hydrogen or ammonia etc.) or oxidizing (oxygen, ozone, water, nitrous oxide, hydrogen peroxide, etc.)

The above steps define one cycle for the methods described herein; and the cycle can be repeated until the desired thickness of a silicon-containing film is obtained. In this or other embodiments, it is understood that the steps of the methods described herein may be performed in a variety of orders, may be performed sequentially or concurrently (e.g., during at least a portion of another step), and any combination thereof. The respective step of supplying the compounds and other reagents may be performed by varying the duration of the time for supplying them to change the stoichiometric composition of the resulting silicon-containing film.

Examples

The flowable chemical vapor deposited (FCVD) films were deposited onto medium resistivity (8-12 Ωcm) single crystal silicon wafer substrates and Si pattern wafers. For the pattern wafers, the preferred pattern width is 20~100 nm with the aspect ratio of 5:1~20:1. The depositions were performed on a modified FCVD chamber on an Applied Materials Precision 5000 system, using a dual plenum showerhead. The chamber was equipped with direct liquid injection (DLI) delivery capability. The precursors were liquids with delivery temperatures dependent on the precursor's boiling point. To deposit the initial flowable silicon oxide films, typical liquid precursor flow rates ranged from about 100 to about 5000 mg/min, preferably 1000 to 2000 mg/min; the chamber pressure ranged from about 0.75-12 Torr, preferably 1 to 3 Torr. Particularly, the remote power was provided by MKS microwave generator from 0 to 3000 W with the frequency of 2.455 GHz, operating from 2 to 8 Torr. To densify the as-deposit flowable films, the films were thermally annealed in vacuum, or in an oxygen environment, using the modified PECVD chamber at 100~1000 C, preferably 300~400 C. Thickness and refractive index (RI) at 632 nm were measured by a SCI reflectometer or Woollam ellipsometer. The typical film thickness ranged from about 10 to about 2000 nm. Bonding properties hydrogen content (Si—H and C—H) of the silicon-based films were measured and analyzed by a Nicolet transmission Fourier transform infrared spectroscopy (FTIR) tool. The flowability and gap fill effects on an Al patterned wafer were observed by a cross-sectional Scanning Electron Microscopy (SEM) using a Hitachi S-4800 system at a resolution of 2.0 nm.

1-Methyl-1-Vinyl-1-Silacyclopetane (MVSCP) was used for flowable SiC film deposition with remote plasma source (RPS). The MVSCP liquid flow was 1500 mg/min, ammonia flow was 1000 sccm, chamber pressure was 1 Torr. The substrate temperature was 60° C., and the microwave power was 3000 W. The as deposited films were thermally annealed, in inert environment, at 400° C. for five minutes. The thickness and refractive index of the as deposited film was 127.1 nm and 1.550.

Figure 2:
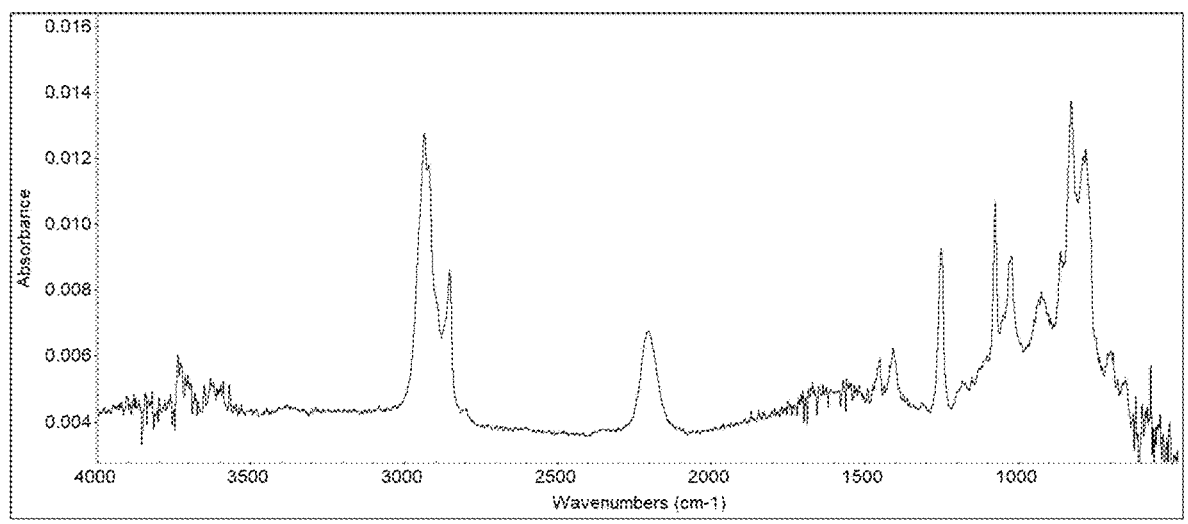
FIG. 2 shows the FTIR spectrum for the as-deposited film of FIG. 1.

Cross-sectional SEM indicated that good gap-fill was achieved on patterned wafers. FIG. 1 showed good gap-fill and no noticeable void formation after thermal annealing. FIG. 2 shows the FTIR spectra for the as-deposited film.

Although certain principles of the invention have been described above in connection with aspects or embodiments, it is to be clearly understood that this description is made only by way of example and not as a limitation of the scope of the invention.

The invention claimed is:

1. A method for depositing a silicon-containing film in a flowable chemical deposition process, the method comprising:

placing a substrate comprising a surface feature into a reactor which is at one or more temperatures ranging from −20° C. to about 150° C., wherein the surface feature comprises a pore, a via, or a trench;

introducing into the reactor a composition comprising at least one silacycloalkane precursor compound represented by formula I:

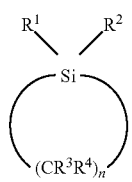

I wherein $R^1$ is selected from the group consisting of a linear or branched $C_1$ to $C_{10}$ alkyl group, cyclic $C_3$ to $C_{10}$ alkyl group, a linear or branched $C_2$ to $C_{10}$ alkenyl group, and a linear or branched $C_2$ to $C_{10}$ alkynyl group; $R^2$ is selected from the group consisting of a linear or branched $C_2$ to $C_6$ alkenyl group, a linear or branched $C_2$ to $C_6$ alkynyl group, and cyclic $C_3$ to $C_{10}$ alkyl group; $R^3$ and $R^4$ are each independently selected from the group consisting of hydrogen, and a linear or branched C to $C_{10}$ alkyl group; and n is an integer from 3-6;

providing a plasma source into the reactor to at least partially react the at least one silacycloalkane precursor compound to form a flowable liquid, wherein the plasma source comprises nitrogen, and wherein the flowable liquid at least partially fills a portion of the surface feature, and wherein the at least one silacycloalkane precursor compound is substantially free of self-polymerization or self-oligomerization impurities, and wherein the at least one silacycloalkane precursor compound comprises impurities at a concentration of 10 ppm or less, the impurities being selected from the group consisting of chlorides, fluorides, bromides, iodides, Li, Na, K, Mg, Ca, Al, Fe, Ni, Cr as measured by IC or ICP MS; and wherein the silicon-containing film is selected from the group consisting of silicon carbide, silicon nitride, carbon doped silicon nitride, silicon oxynitride, and carbon doped silicon oxynitride film.

2. The method of claim 1 wherein the plasma source comprises oxygen and is selected from the group consisting of water ($H_2O$) plasma, oxygen plasma, ozone ($O_3$) plasma, NO plasma, $N_2O$ plasma, carbon monoxide (CO) plasma, carbon dioxide ($CO_2$) plasma and combinations thereof.

3. The method of claim 1 wherein the plasma source comprises nitrogen and is selected from the group consisting of nitrogen plasma, a plasma comprising nitrogen and hydrogen, a plasma comprising nitrogen and helium, a plasma comprising nitrogen and argon, ammonia plasma, a plasma comprising ammonia and helium, a plasma comprising ammonia and argon, a plasma comprising ammonia and nitrogen, $NF_3$, $NF_3$ plasma, organic amine plasma, and mixtures thereof.

4. The method of claim 1 wherein the plasma source comprises hydrogen and is selected from the group consisting of hydrogen plasma, a plasma comprising hydrogen and helium, a plasma comprising hydrogen and argon, and mixtures thereof.

5. The method of claim 1 wherein the deposition process is a plasma enhanced chemical vapor deposition and the plasma is generated in situ.

6. The method of claim 1 wherein the deposition process is a plasma enhanced chemical vapor deposition and the plasma is generated remotely.

7. The method of claim 1 wherein a pressure of the reactor is maintained at 100 torr or less.

8. The method of claim 1 wherein the deposited film is further treated after deposition with thermal anneal, UV annealing, or e-beam treatment to improve or modify the film properties.

9. The method of claim 8 wherein the post treatment is carried out in a reactive environment.

10. The method of claim 1 wherein the composition comprising the at least one silacycloalkane precursor compound further comprises a stabilizer selected from the group consisting of 2,6-di-tert-butyl-4-methyl phenol (or BHT for butylhydroxytoluene), 2,2,6,6-tetramethyl-1-piperidinyloxy (TEMPO), 2-tert-butyl-4-hydroxyanisole, 3-tert-butyl-4-hydroxyanisole, propyl ester 3,4,5-trihydroxy-benzoic acid, 2-(1,1-dimethylethyl)-1,4-benzenediol, diphenylpicrylhydrazyl, 4-tert-butylcatechol, N-methylaniline, p-methoxydiphenylamine, diphenylamine, N,N'-diphenyl-p-phenylenediamine, p-hydroxydiphenylamine, phenol, octadecyl-3-(3,5-di-tert-butyl-4-hydroxyphenyl) propionate, tetrakis (methylene (3,5-di-tert-butyl)-4-hydroxy-hydrocinnamate) methane, phenothiazines, alkylamidonoisoureas, thiodiethylene bis (3,5,-di-tert-butyl-4-hydroxy-hydrocinnamate, 1,2,-bis (3,5-di-tert-butyl-4-hydroxyhydrocinnamoyl) hydrazine, tris (2-methyl-4-hydroxy-5-tert-butylphenyl) butane, cyclic neopentanetetrayl bis (octadecyl phosphite), 4,4'-thiobis (6-tert-butyl-m-cresol), 2,2'-methylenebis (6-tert-butyl-p-cresol), and oxalyl bis (benzylidenehydrazide).

11. The method of claim 1, wherein the surface features has an aspect ratio of 5:1 or greater.

12. The method of claim 11, wherein the surface features has an aspect ratio of 10:1 or greater.

13. The method of claim 1, wherein a sum of all chlorides, fluorides, bromides, iodides, Li, Na, K, Mg, Ca, Al, Fe, Ni, and Cr impurities analyzed by gas chromatography (GC) is less than 1.0 wt. %.

14. A method for depositing a silicon-containing film in a flowable chemical deposition process, the method comprising:

placing a substrate comprising surface features having pores, vias, or trenches into a reactor which is at one or more temperatures ranging from −20° C. to about 150° C.;

introducing into the reactor a composition comprising at least one silacycloalkane precursor compound selected from the group consisting of selected from the group consisting of 1,1-divinyl-1-silacyclobutane, 1-methyl-1-vinyl-1-silacyclobutane, 1-ethyl-1-vinyl-1-silacyclobutane, 1,1-divinyl-1-silacyclopentane, 1-methyl-1-vinyl-1-silacyclopentane, 1-ethyl-1-vinyl-1-silacyclopentane, 1,1-divinyl-1-silacyclohexane, 1-methyl-1-vinyl-1-silacyclohexane, or 1-ethyl-1-vinyl-1-silacyclohexane, 1,1-diallyl-1-silacyclobutane, 1-methyl-1-allyl-1-silacyclobutane, 1-ethyl-1-allyl-1-silacyclobutane, 1,1-diallyl-1-silacyclopentane, 1-methyl-1-allyl-1-silacyclopentane, 1-ethyl-1-allyl-1-silacyclopentane, 1,1-diallyl-1-silacyclohexane, 1-methyl-1-allyl-1-silacyclohexane, or 1-ethyl-1-allyl-1-silacyclohexane, 1,1-diethynyl-1-silacyclobutane, 1-methyl-1-ethynyl-1-silacyclobutane, 1-ethyl-1-ethynyl-1-silacyclobutane, 1,1-ethynyl-1-silacyclopentane, 1-methyl-1-ethynyl-1-silacyclopentane, 1-ethyl-1-ethynyl-1-silacyclopentane, 1,1-di ethynyl-1-silacyclohexane, 1-methyl-1-ethynyl-1-silacyclohexane, and 1-ethyl-1-ethynyl-1-silacyclohexane;

providing a plasma source comprising nitrogen into the reactor to at least partially react the at least one silacycloalkane precursor compound to form a flowable liquid wherein the flowable liquid at least partially fills a portion of the surface features, wherein the at least one silacycloalkane precursor compound is substantially free of self-polymerization or self-oligomerization impurities, and wherein the at least one silacycloalkane precursor compound comprises impurities at a concentration of 10 ppm or less, the impurities being selected from the group consisting of chlorides, fluorides, bromides, iodides, Li, Na, K, Mg, Ca, Al, Fe, Ni, Cr as measured by IC or ICP MS; and wherein the silicon-containing film is selected from the group consisting of silicon carbide, silicon nitride, carbon doped silicon nitride, silicon oxynitride, and carbon doped silicon oxynitride film.

15. The method of claim 14 wherein the plasma source comprises oxygen and is selected from the group consisting of water ($H_2O$) plasma, oxygen plasma, ozone ($O_3$) plasma, NO plasma, $N_2O$ plasma, carbon monoxide (CO) plasma, carbon dioxide ($CO_2$) plasma and combinations thereof.

16. The method of claim 14 wherein the plasma source comprises hydrogen and is selected from the group consisting of hydrogen plasma, a plasma comprising hydrogen and helium, a plasma comprising hydrogen and argon, and mixtures thereof.

17. The method of claim 14 wherein the plasma source comprises nitrogen and is selected from the group consisting of nitrogen plasma, a plasma comprising nitrogen and hydrogen, a plasma comprising nitrogen and helium, a plasma comprising nitrogen and argon, ammonia plasma, a plasma comprising ammonia and helium, a plasma comprising ammonia and argon, a plasma comprising ammonia and nitrogen, $NF_3$, $NF_3$ plasma, organic amine plasma, and mixtures thereof.

18. The method of claim 14 wherein the deposition process is a plasma enhanced chemical vapor deposition and the plasma is generated in situ.

19. The method of claim 14 wherein the deposition process is a plasma enhanced chemical vapor deposition and the plasma is generated remotely.

20. The method of claim 14 wherein a pressure of the reactor is maintained at 100 torr or less.

21. The method of claim 14 wherein the deposited film is further treated after deposition with thermal anneal, UV annealing, or e-beam treatment to improve or modify the film properties.

22. The method of claim 21 wherein the post treatment is carried out in a reactive environment.

23. The method of claim 14 wherein the composition comprising the at least one silacycloalkane precursor compound further comprises a stabilizer selected from the group consisting of 2,6-di-tert-butyl-4-methyl phenol (or BHT for butylhydroxytoluene), 2,2,6,6-tetramethyl-1-piperidinyloxy (TEMPO), 2-tert-butyl-4-hydroxyanisole, 3-tert-butyl-4-hydroxyanisole, propyl ester 3,4,5-trihydroxy-benzoic acid, 2-(1,1-dimethylethyl)-1,4-benzenediol, diphenylpicrylhydrazyl, 4-tert-butylcatechol, N-methylaniline, p-methoxydiphenylamine, diphenylamine, N,N'-diphenyl-p-phenylenediamine, p-hydroxydiphenylamine, phenol, octadecyl-3-(3,5-di-tert-butyl-4-hydroxyphenyl) propionate, tetrakis (methylene (3,5-di-tert-butyl)-4-hydroxy-hydrocinnamate) methane, phenothiazines, alkylamidonoisoureas, thiodiethylene bis (3,5,-di-tert-butyl-4-hydroxy-hydrocinnamate, 1,2,-bis (3,5-di-tert-butyl-4-hydroxyhydrocinnamoyl) hydrazine, tris (2-methyl-4-hydroxy-5-tert-butylphenyl) butane, cyclic neopentanetetrayl bis (octadecyl phosphite), 4,4'-thiobis (6-tert-butyl-m-cresol), 2,2'-methylenebis (6-tert-butyl-p-cresol), and oxalyl bis (benzylidenehydrazide).

24. The method of claim 14, wherein a sum of all chlorides, fluorides, bromides, iodides, Li, Na, K, Mg, Ca, Al, Fe, Ni, and Cr impurities analyzed by gas chromatography (GC) is less than 1.0 wt. %.

* * * * *